(12) United States Patent
Williams (10) Patent No.: US 10,514,428 B2
(45) Date of Patent: Dec. 24, 2019

(54) TECHNIQUE TO DETECT MOTOR LEAKAGE FLUX ANOMALIES

(71) Applicant: ITT MANUFACTURING ENTERPRISES LLC, Wilmington, DE (US)

(72) Inventor: Dean Patrick Williams, Moravia, NY (US)

(73) Assignee: ITT MANUFACTURING ENTERPRISES LLC, Wilmington, DE (US)

( * ) Notice: Subject to any disclaimer, the term of this patent is extended or adjusted under 35 U.S.C. 154(b) by 0 days.

(21) Appl. No.: 15/648,855

(22) Filed: Jul. 13, 2017

(65) Prior Publication Data

US 2019/0018073 A1 Jan. 17, 2019

(51) Int. Cl.
*G01R 33/00* (2006.01)
*G01R 33/02* (2006.01)
*G01R 31/34* (2006.01)

(52) U.S. Cl.
CPC ....... *G01R 33/0017* (2013.01); *G01R 31/346* (2013.01); *G01R 33/02* (2013.01)

(58) Field of Classification Search
CPC .............................. G01R 33/0017; G01R 33/02
See application file for complete search history.

(56) References Cited

U.S. PATENT DOCUMENTS

| | | |
|---|---|---|
| 4,761,703 A | 8/1988 | Kliman et al. |
| 4,808,932 A | 2/1989 | Schulz, Jr. et al. |
| 5,049,815 A | 9/1991 | Kliman |
| 5,252,915 A | 10/1993 | Sedding et al. |
| 5,477,163 A | 12/1995 | Kliman |
| 5,530,343 A | 6/1996 | Bowers, III et al. |
| 5,594,175 A | 1/1997 | Lyon et al. |
| 5,612,601 A | 3/1997 | Kueck et al. |

(Continued)

FOREIGN PATENT DOCUMENTS

| | | |
|---|---|---|
| EP | 1540186 B1 | 9/2010 |
| EP | 2919027 A1 | 9/2015 |

(Continued)

OTHER PUBLICATIONS

Goktas, Broken rotor bar fault monitoring based on fluxgate sensor measurement of leakage flux, IEMDC, May 2017.*

(Continued)

*Primary Examiner* — Daniel R Miller
(74) *Attorney, Agent, or Firm* — Hertzberg, Turk & Associates, LLC (57) ABSTRACT

A signal processor is configured to receive signaling containing information about a sensed sinusoidal waveform of magnetic flux caused by a current flowing in a winding of a motor having a component of distortion caused at least in part by a magnetic flux created by the current flowing, and also about a pure sinusoidal waveform of a sensed fundamental frequency of the magnetic flux; and determine corresponding signaling containing information about anomalies in the motor that depends on a relationship between the sensed sinusoidal waveform and the pure sinusoid waveform, based upon the signaling received. The signaling may be sensed and provided by a motor magnetic flux sensor attached externally to the motor frame.

18 Claims, 5 Drawing Sheets

(56) References Cited

U.S. PATENT DOCUMENTS

| | | | |
|---|---|---|---|
| 5,629,870 | A | 5/1997 | Farag et al. |
| 5,726,905 | A | 3/1998 | Yazici et al. |
| 5,726,911 | A | 3/1998 | Canada et al. |
| 5,739,698 | A | 4/1998 | Bowers et al. |
| 5,742,522 | A | 4/1998 | Yazici et al. |
| 5,786,708 | A | 7/1998 | Premerlani et al. |
| 6,014,598 | A | 1/2000 | Duyar et al. |
| 6,064,172 | A | 5/2000 | Kuznetsov |
| 6,138,078 | A | 10/2000 | Canada et al. |
| 6,172,509 | B1 | 1/2001 | Cash et al. |
| 6,199,018 | B1 | 3/2001 | Quist et al. |
| 6,262,550 | B1 | 7/2001 | Kliman et al. |
| 6,393,373 | B1 | 5/2002 | Duyar et al. |
| 6,529,135 | B1 | 3/2003 | Bowers et al. |
| 6,590,362 | B2 | 7/2003 | Parlos et al. |
| 6,636,823 | B1 | 10/2003 | Unsworth et al. |
| 6,834,256 | B2 | 12/2004 | House et al. |
| 6,941,785 | B2 | 9/2005 | Haynes et al. |
| 7,024,335 | B1 | 4/2006 | Parlos |
| 7,116,068 | B2 | 10/2006 | Boesch et al. |
| 7,231,319 | B2 | 6/2007 | Dimino et al. |
| 7,254,514 | B2 | 8/2007 | House et al. |
| 7,277,800 | B2 | 10/2007 | Sheahan, Jr. et al. |
| 7,308,322 | B1 | 12/2007 | Discenzo et al. |
| 7,324,008 | B2 | 1/2008 | Payne et al. |
| 7,336,455 | B2 | 2/2008 | Dimino et al. |
| 7,646,308 | B2 | 1/2010 | Paoletti et al. |
| 7,712,367 | B2 | 5/2010 | Eckert et al. |
| 7,847,580 | B2 | 12/2010 | Zhou et al. |
| 7,880,473 | B2 | 2/2011 | Chari et al. |
| 8,217,644 | B2 | 7/2012 | Younsi et al. |
| 8,253,365 | B2 | 8/2012 | Yeh |
| 8,378,605 | B2 | 2/2013 | Wang et al. |
| 8,401,822 | B2 | 3/2013 | Dimino et al. |
| 8,405,339 | B2 | 3/2013 | Zhang et al. |
| 8,600,685 | B2 | 12/2013 | Kalgren et al. |
| 8,913,353 | B2 | 12/2014 | Gu et al. |
| 8,947,028 | B2 | 2/2015 | Gu et al. |
| 9,097,767 | B2 | 8/2015 | Howell et al. |
| 9,203,342 | B2 | 12/2015 | Rongve et al. |
| 9,255,970 | B2 | 2/2016 | Nett et al. |
| 9,261,562 | B2 | 2/2016 | Lee et al. |
| 9,372,482 | B2 | 6/2016 | Rikkola et al. |
| 2003/0193310 | A1 | 10/2003 | Raftari et al. |
| 2009/0096405 | A1 | 4/2009 | Flickinger et al. |
| 2009/0322373 | A1 | 12/2009 | Dooley |
| 2010/0169030 | A1 | 7/2010 | Parlos |
| 2013/0013138 | A1 | 1/2013 | Lu et al. |

FOREIGN PATENT DOCUMENTS

| | | |
|---|---|---|
| EP | 2971989 A1 | 1/2016 |
| WO | 2014027339 A1 | 2/2014 |
| WO | 2015179775 A1 | 11/2015 |

OTHER PUBLICATIONS

Faiz, Mixed Fault Diagnosis in Three-Phase Squirrel-Cage Induction Motor Using Analysis of Air-Gap Magnetic Field, Progress in Electromagnetics Research, Pier 64, 239-255, 2006.*

Nagarajan et al., Diagnosis and Characterization of Effects of Broken Bars in Three Phase Squirrel Cage Induction Motor Using Finite Element Method, ARPN Journal of Engineering and Applied Sciences, vol. 7, No. 9, Sep. 2012.*

Rigoni et al., Detection and Analysis of Rotor Faults in Induction Motors by the Measurement of the Stray Magnetic Flux, Journal of Microwaves, Optoelectronics and Electromagnetic Applications, vol. 11, No. 1, Jun. 2012.*

Siddiqui, Khadim Moin, Kuldeep Sahay, and V. K. Giri, "Health monitoring and fault diagnosis in induction motor—a review," International Journal of Advanced Research in Electrical, Electronics and Instrumentation Engineering Volume, Issue 3.1, Jan. 2014, pp. 6549-6565. http://www.academia.edu/download/39817096/12_Health.pdf.

Niaoqing, Hu, et al., "Early, Fault Detection Using a Novel Spectrum Enhancement Method for Motor Current Signature Analysis," 7 WSEAS Int. Conf. on Artificial Intelligence Knowledge Engineering and Data Bases (AIKED'08), University of Cambridge, Feb. 20-22, 2008. http://www.wseas.us/e-library/conferences/2008/uk/AIKED/AIKED-70.pdf.

Ozelgin, Ilker, "Analysis of magnetic flux density for airgap eccentricity and bearing faults," International Journal of Systems Applications, Engineering & Development Issue 4, vol. 1, 2008, pp. 162-169. http://www.wseas.us/journals/saed/saed-48.pdf.

Negrea, Marian, "Fault Diagnostics of Electrical AC Machines," Literature Survey, pp. 1-65, printed Jan. 2017. http://homes.et.aau.dk/aer/nsnmsc3diagnostics/copiesnpapers/Part1Papers/[Part1-08]%20FaultdiagnosisLiteratue%20Survey_Marian%20Negrea.pdf.

* cited by examiner

FIG. 1: Sine Wave Function

FIG. 2: Motor Flux (with distortion riding on wave shape)

FIG. 3: Motor Flux Subtracted from Sine Wave

Apparatus 10

Signal processor or processing module 10a configured at least to:

receive signaling containing information about a sensed sinusoidal waveform of magnetic flux caused by a current flowing in a winding of a motor having a component of distortion caused at least in part by a magnetic flux created by the current flowing, and also about a pure sinusoidal waveform of a sensed fundamental frequency of the magnetic flux;

determine corresponding signaling containing information about anomalies in the motor that depends on a relationship between the sensed sinusoidal waveform and the pure sinusoid waveform, based upon the signaling received; and/or provide the corresponding signaling containing information about the anomalies in the motor, including for further processing.

Other signal processor circuits or components 10b that do not form part of the underlying invention, e.g., including input/output modules, one or more memory modules, data, address and control busing architecture, etc.

Motor 20, e.g., configured to drive a pump, having an outer frame 20a with a motor leakage flux detector 20b thereto.

Pump 30, e.g., configured to be driven by the motor 20

The Flowchart 50

Step 50a: Receiving in a signal processor or processing module 10a signaling containing information about a sensed sinusoidal waveform of magnetic flux caused by a current flowing in a winding of a motor having a component of distortion caused at least in part by a magnetic flux created by the current flowing, and also about a pure sinusoidal waveform of a sensed fundamental frequency of the magnetic flux;

Step 50b: Determining in the signal processor or processing module 10a corresponding signaling containing information about anomalies in the motor that depends on a relationship between the sensed sinusoidal waveform and the pure sinusoid waveform, based upon the signaling received; and/or Step 50c: Providing from the signal processor or processing module 50a the corresponding signaling containing information about the about anomalies in the motor, including for further processing.

Step 50d: Arranging an outer frame 20a of a motor 20 with a motor leakage flux detector 20b to sense the sinusoidal waveform of the current flowing in the winding of the motor having the distortion caused at least in part by the magnetic flux created by the current flowing

*FIG. 6*: The Basic Method/Algorithm

TECHNIQUE TO DETECT MOTOR LEAKAGE FLUX ANOMALIES

BACKGROUND OF THE INVENTION

1. Field of the Invention

This application relates to a technique for detecting motor leakage flux anomalies; and more particularly to technique for detecting motor leakage flux anomalies in a motor.

2. Brief Description of Related Art

The following techniques are known in the art:

EP 1046044 B1 discloses a technique based upon using a differential current transformer to sense ground leakage current, and processes the signal to allow easy alarm trips, e.g., using a current transformer (amps) sensor placed in series with the power conductors feeding the motor. The EP 1046044 B1 technique does not track the motor load via the leakage flux and a flux sensor to sense changes in the load to indicate anomalies in operation before catastrophic damage occurs.

U.S. Pat. No. 5,680,025 discloses a technique that uses a flux coil to sense motor load and flux signals, but does not disclose the ability to cancel out sinusoids.

U.S. Pat. No. 6,308,140 B1 discloses a technique that senses motor current, not flux, and uses the motor current to detect broken rotor bars in the motor.

U.S. Pat. No. 7,880,473 discloses a technique for non-invasive monitoring and diagnosis of a motor by measuring external flex density by comparing a combined value of magnetic field values measured at various points external to the motor to an expected combined value to determine if a fault is present in the motor.

No technique are known in the art for sensing motor flux non-invasively, and cancelling out sinusoid waveforms and using the resultant signal for baselining and trending, thereby allowing for accurate comparing and diagnosis for the purpose of indicating pending motor failure with an accurate diagnosis.

In view of this, there is a need in the industry for a better way for detecting electrical and mechanical faults in a motor driving a pump.

SUMMARY OF THE INVENTION

In summary, and in contrast to the prior art techniques set forth above, the present invention provides a new and unique technique for detecting motor leakage flux anomalies, which is based upon attached a magnetic flux sensor to the motor frame. In particular, a motor leakage flux detector, e.g., including a fluxgate device, may be attached to the motor's outer frame.

Specific Embodiments of the Present Invention

According to some embodiments, the present invention may take the form of apparatus, e.g., such as a controller for a motor driving a pump, featuring:
a signal processor configured to
receive signaling containing information about a sensed sinusoidal waveform of magnetic flux caused by a current flowing in a winding of a motor having a component of distortion caused at least in part by a magnetic flux created by the current flowing, and also about a pure sinusoidal waveform of a sensed fundamental frequency of the magnetic flux; and
determine corresponding signaling containing information about anomalies in the motor that depends on a relationship between the sensed sinusoidal waveform and the pure sinusoid waveform, based upon the signaling received.

The present invention may also include one or more of the following features:

The signaling may be sensed and provided by a motor magnetic flux sensor arranged in relation to the winding.

The apparatus may include the motor magnetic flux sensor.

The apparatus may include the motor having a motor frame; and the motor magnetic flux sensor is attached to the motor frame, including where the motor frame is an outer motor frame and the motor magnetic flux sensor is a leakage magnetic flux sensor.

The sensed sinusoidal waveform has a sinewave component with distortion riding on the sensed sinusoidal waveform.

The relationship may be a difference between the sinusoidal waveform and the pure sinusoidal waveform of the fundamental frequency of the magnetic flux, that results in a non-sinusoid magnetic flux waveform of magnetic flux distortion.

The signal processor may be configured to store and record in a memory module baseline signaling containing information about a baseline difference for subsequent comparison with a subsequent difference determined at a later point in time.

The magnetic flux distortion may contain information about either mechanical or electrical pending failure.

The mechanical failure may include vibration caused by a misalignment, an out of balance condition, or one or more failing bearings.

The electrical failure may include e.g. a partially shorted winding, a broken rotor bar, an eccentric air gap, or damaged laminations.

The signal processor may be configured to process associated signaling containing information about the non-sinusoid magnetic flux waveform to determine mechanical or electrical pending failure, e.g., by using one or more of the following techniques:
implementing a dynamically boosted gain technique on the associated signaling to amplify minor flux distortions for further analysis; or
implementing a fundamental sinewave cancellation technique that allows for a motor's non sinusoidal flux "signature" to be recorded/stored during a period of known proper operation for establishing a motor's non sinusoidal flux "signature" baseline, that allows for a subsequent motor's non sinusoidal flux "signature" to be recorded/stored during a subsequent period of operation, and that also allows a comparison analysis of the motor's non sinusoidal flux "signature" baseline and the subsequent motor's non sinusoidal flux "signature" to determine one or more minimum deviations over time regarding corresponding wave shapes in both amplitude and frequency; or
establishing an alarm threshold for a deviation value that indicates an abnormal condition, including where the abnormal condition is not a condition to cause immediate damage, so a motor system may be investigated for a potential abnormal condition while the motor system is running, and not stopped due to a damaging fault.

The signal processor may be configured to process associated signaling containing information about the non-sinusoid magnetic flux waveform performing a spectral analysis, including using Fast Fourier Transform analysis, to determine the anomalies based upon a comparison a baseline sinusoidal waveform determined during normal operation at a first point in time and a subsequent sinusoidal waveform determined at a second and later point in time.

The signaling received at the first point in time may contain information about the baseline sinusoidal waveform of the current flowing in the winding of the motor having the distortion caused at least in part by the magnetic flux created by the current flowing during the normal operation, and the signaling received at the second point in time contains information about the subsequent sinusoidal waveform of the current flowing in the winding of the motor having the distortion caused at least in part by the magnetic flux created by the current flowing at the second and later point in time.

The motor may be an AC induction motor configured to draw a pure sinusoid waveform of current when supplied with a sinusoid AC voltage.

The signal processor may be configured to decompose the signaling received to determine first signaling containing information about the sinusoidal waveform of the current flowing in the winding of the motor, and determine second signaling containing information about the distortion caused at least in part by the magnetic flux created by the current flowing.

The signaling received may include first signaling containing information about the sinusoidal waveform of the current flowing in the winding of the motor, and includes second signaling containing information about the distortion caused at least in part by the magnetic flux created by the current flowing.

The signal processor may be configured to provide the corresponding signaling determined containing information about the anomalies in the motor.

The corresponding signaling determined may contain information about the mechanical failure, including the vibration caused by the misalignment, the out of balance condition, or the one or more failing bearings.

The corresponding signaling determined may contain information about the electrical failure, including the partially shorted winding, the broken rotor bar, the eccentric air gap, or the damaged laminations.

The signal processor may be configured to provide the corresponding signaling for further processing, including as control signaling.

The apparatus may include, or takes the form of, a controller, e.g., having the signal processor.

According to some embodiments, the apparatus may include, or takes the form of, the pump system having the controller with the signal processor for implementing the aforementioned signal processing functionality. The pump system may include the motor and a pump driven by the motor.

According to some embodiments, the present invention may take the form of a method featuring steps for:
  receiving in a signal processor signaling containing information about a sensed sinusoidal waveform of magnetic flux caused by a current flowing in a winding of a motor having a component of distortion caused at least in part by a magnetic flux created by the current flowing, and also about a pure sinusoidal waveform of a sensed fundamental frequency of the magnetic flux; and
  determining in the signal processor corresponding signaling containing information about anomalies in the motor that depends on a relationship between the sensed sinusoidal waveform and the pure sinusoid waveform, based upon the signaling received.

The method may include providing with the signal processor the corresponding signaling for further processing, including as control signaling, as well as one or more of the features set forth herein.

In effect, the present invention provides a new and unique for sensing motor flux non-invasively, and cancelling out sinusoid waveforms and using the resultant signal for baselining and trending, thereby allowing for accurate comparing and diagnosis for the purpose of indicating pending motor failure with an accurate diagnosis.

BRIEF DESCRIPTION OF THE DRAWING

The drawing, not necessarily drawn to scale, includes the following Figures.

Not every reference numeral is included in every Figure, e.g., so as to reduce clutter in the drawing as a whole.

DETAILED DESCRIPTION OF THE INVENTION

The Basic Invention

Figure 1:
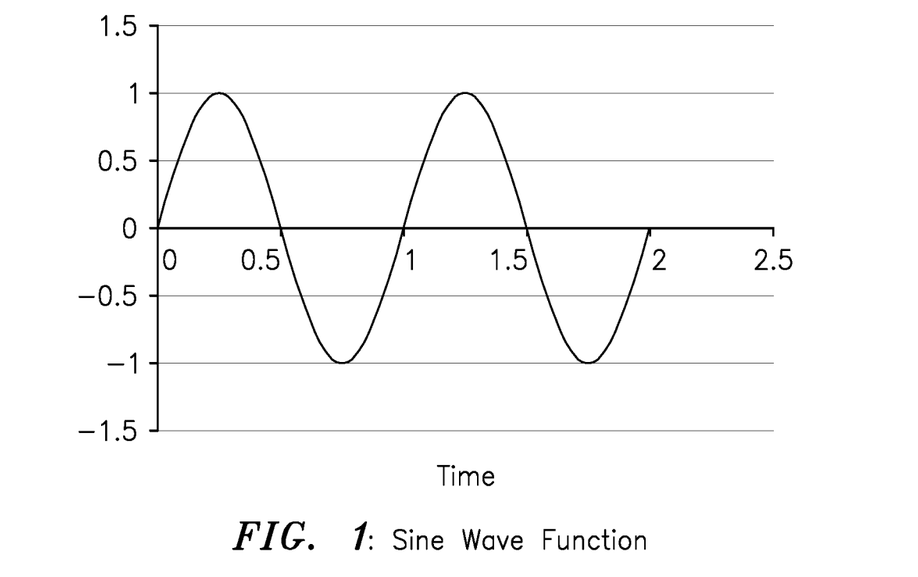
FIG. 1 shows a graph of a sine wave function (amplitude vs. time) of a pure sinusoid waveform of current, e.g., which is typically provided to an AC induction motor.

An AC induction motor like element 20 (FIG. 4), e.g., for driving a pump like element 30 (FIG. 4), is designed to draw a pure sinusoid waveform of current when supplied with a sinusoid AC voltage. For example, see the sine wave function shown in FIG. 1.

This current flowing in the motor's windings (20c (FIG. 5)) will create a sinusoid of magnetic flux. According to the present invention, for diagnosis of motor and/or load problems, it is imperative to examine the magnetic flux that is not sinusoidal. For example, see the motor flux function shown in FIG. 2.

Figure 2:
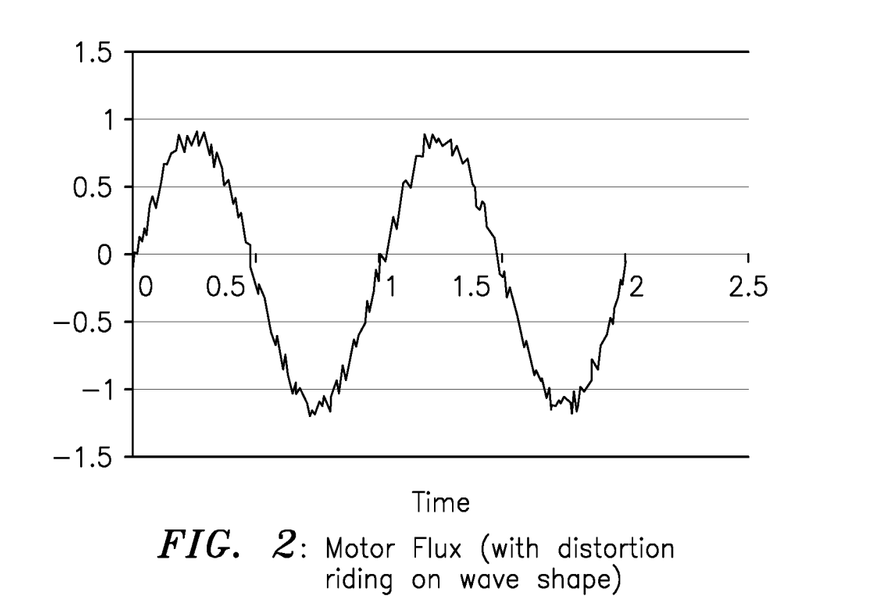
FIG. 2 shows a graph of a waveform (amplitude vs. time) of magnetic flux created by the current flowing in the AC induction motor, e.g., received from a motor magnetic flux sensor attached to an outer frame of the motor, having a sinewave component with distortion riding on the wave shape.

The waveform in FIG. 2, e.g., received from the motor magnetic flux sensor like element 20b, has a sinewave component with distortion riding on the wave shape. The flux distortion is the indicating component of anomalies that allow for diagnosis of abnormalities. This flux distortion could indicate either mechanical or electrical pending failure. Examples of mechanical failure are vibration caused by misalignment, out of balance, failing bearings, etc. Examples of electrical failure could also be representative of the motor's windings or rotor developing a pending failure, e.g. partially shorted winding, broken rotor bar, eccentric air gap, damaged laminations, etc.

Figure 3:
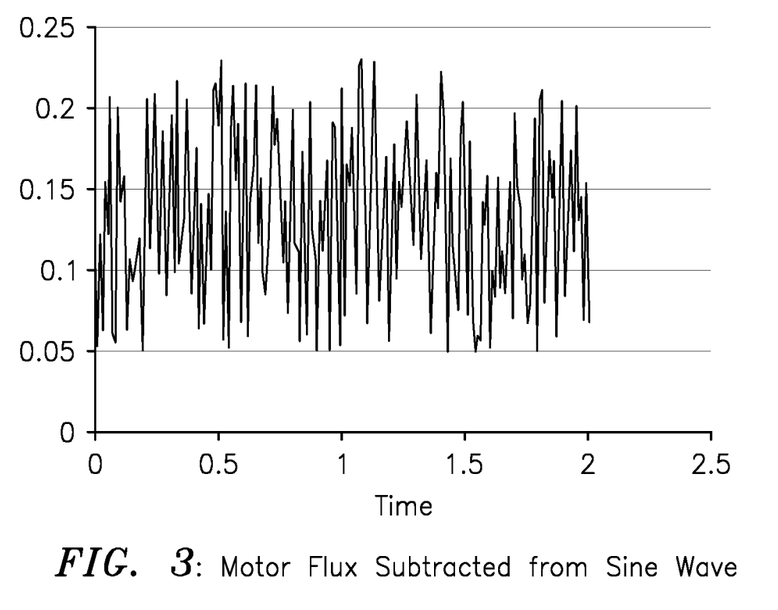
FIG. 3 shows a graph of a non-sinusoidal waveform (amplitude vs. time) of magnetic flux minus the sine wave function by the current flowing in the AC induction motor, e.g., for diagnosing potential motor and/or load problems.

According to the present invention, the technique herein proposes to sense the fundamental frequency of the magnetic flux, and mathematically subtract the exact same frequency as a pure sinusoid waveform. The signal that remains is the non-sinusoid magnetic flux (see FIG. 3), which can be processed to diagnose potential motor and/or load problems.

Numerous processes can be performed on the resultant signal. For example, one very important technique is a dynamically boosted gain of the resultant signal to allow much improved examination of minor flux distortions. By greatly amplifying these very small signals, improved diagnosis of previously undiscovered anomalies can be performed.

In addition, fundamental sinewave cancellation allows for a motor's non sinusoidal flux "signature" to be recorded (e.g., sensed and stored in a suitable memory module like that forming part of element 10b) during a period of known proper operation, also called "base lining". This ability to provide a very detailed comparison to the non-sinusoidal component allows for a more accurate baseline signal to be established during a known good operational period.

By performing a comparison analysis of a questionable signal to the baseline signal recorded, minimum deviation over time regarding wave shape in both amplitude and frequency can be determined. By establishing an alarm threshold for a deviation value that indicates an abnormal condition, but not a condition to cause immediate damage, the user may investigate a potential abnormal condition while the system is running, and not stopped due to a damaging fault.

Lastly, a spectral analysis, e.g. using a Fast Fourier Transform analysis, can easily be performed to indicate anomalies from normal operation.

Figure 5:
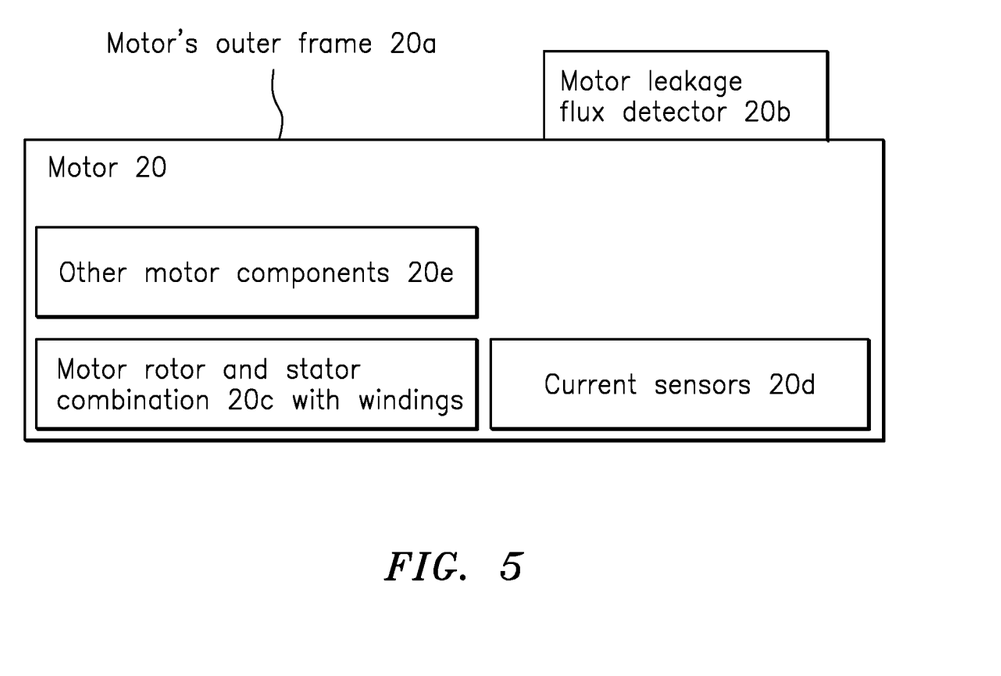
FIG. 5 shows a block diagram of a motor having an outer frame with a motor leakage flux detector arranged thereon, e.g., including a fluxgate device, according to some embodiments of the present invention.

By using a motor leakage sensor 20b attached to the outer frame 20a of the motor 20, one can non-invasively sense motor leakage. By subtracting the known good sinusoidal signal from the motor's non-sinusoidal flux signature, one can record a baseline of a known good working motor. That unique profile can be used to compare against future anomalies to determine pending failure.

By way of further example, embodiments are also envisioned using the addition of current sensors 20d to sense motor current versus leakage flux sensors, but the same method could be used to trend the motor's current signature and compare future operations. However, adding current sensors 20d would be a non-invasive solution.

Figure 4:
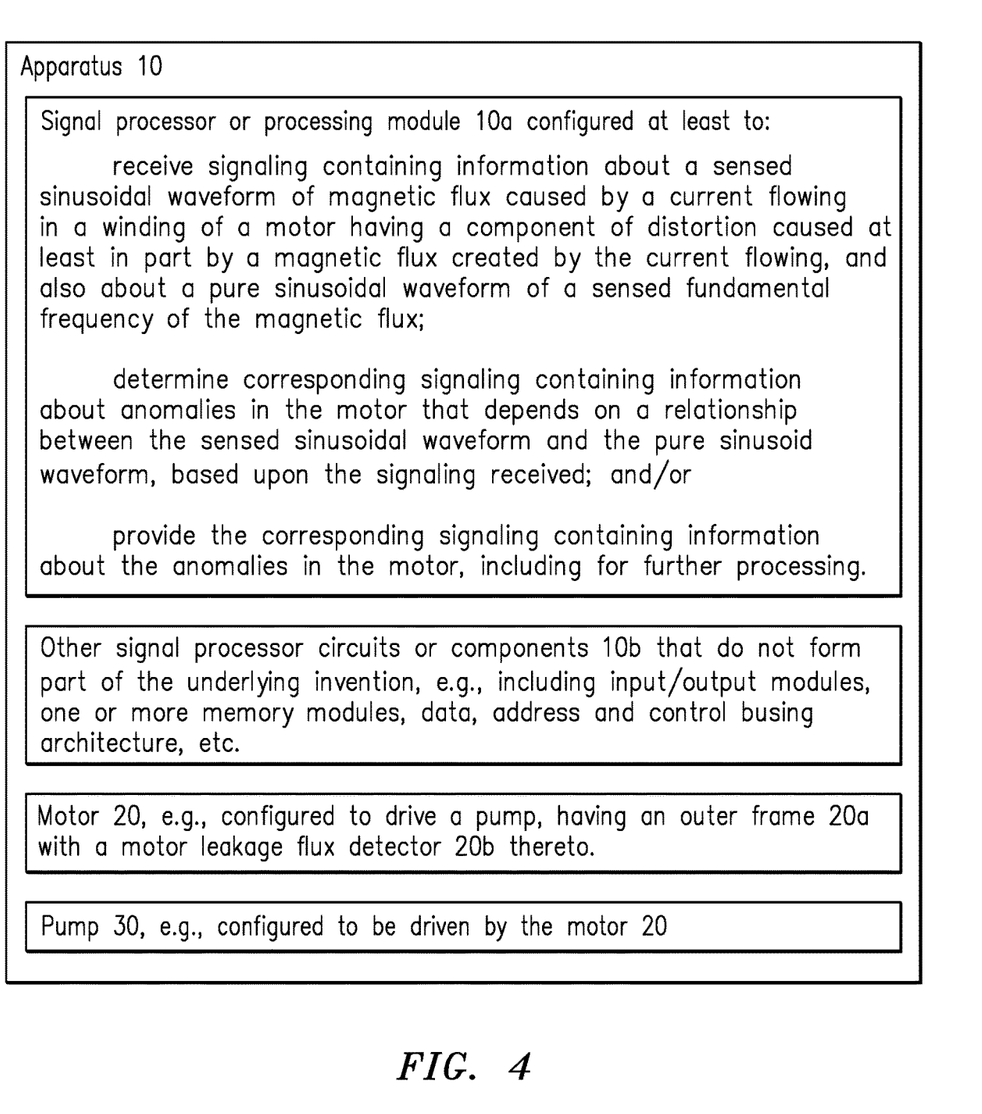
FIG. 4 shows apparatus having a signal processor configured to process signaling received and determine corresponding signaling containing information about anomalies in a motor, e.g., for driving a pump, according to some embodiments of the present invention.

FIG. 4: The Basic Apparatus 10, Including a Pump System

FIG. 4 shows apparatus generally indicated as 10 according to some embodiments of the present invention, e.g., including a combination of a signal processor or signal processing module 10a, other signal processor circuits or components 10b, the motor 20 and the pump 30.

In operation, the signal processor or signal processor module 10a may be configured to receive signaling containing information about a sensed sinusoidal waveform of magnetic flux caused by a current flowing in a winding of a motor having a component of distortion caused at least in part by a magnetic flux created by the current flowing, and also about a pure sinusoidal waveform of a sensed fundamental frequency of the magnetic flux; and determine corresponding signaling containing information about anomalies in the motor that depends on a relationship between the sensed sinusoidal waveform and the pure sinusoid waveform, based upon the signaling received.

By way of example, the functionality of the signal processor 10a may be implemented using hardware, software, firmware, or a combination thereof. In a typical software implementation, the signal processor or signal processing module 10a would include one or more microprocessor-based architectures having, e. g., at least one processor or microprocessor, random access memory (RAM) and/or read only memory (ROM), input/output devices and control, and data and address buses connecting the same, and/or at least one input processor and at least one output processor. A person skilled in the art would be able to program such a microcontroller (or microprocessor)-based implementation to perform the functionality described herein without undue experimentation. The scope of the invention is not intended to be limited to any particular implementation using technology either now known or later developed in the future. The scope of the invention is intended to include implementing the functionality of the signal processor as stand-alone processor or processor module, as separate processor or processor modules, as well as some combination thereof.

By way of example, after reading the instant patent application, one skilled in the art would appreciate without undue experimentation how to implement the signal processor 10a to receive the signaling containing information about the sensed sinusoidal waveform of magnetic flux caused by the current flowing in the winding of the motor having the component of distortion caused at least in part by the magnetic flux created by the current flowing, and also about the pure sinusoidal waveform of the sensed fundamental frequency of the magnetic flux. The implementation may include the signal processor 10a cooperating, or working in conjunction with, the input/output module forming part of the other component or circuitry forming part of element 10b.

By way of further example, after reading the instant patent application, one skilled in the art would appreciate without undue experimentation how to implement the signal processor 10a to determine the corresponding signaling containing information about the anomalies in the motor that depends on the relationship between the sensed sinusoidal waveform and the pure sinusoid waveform, e.g., including mechanical and/or electrical anomalies as set forth herein. By way of example, vibration of the motor and the motor leakage sensor 20b in relation to the windings of the motor may cause irregularities in the sensed motor flux that may distort the waveform of the magnetic flux sensed by the motor leakage sensor 20b. The signal processor 10a may be configured to use the baseline signature analysis to process the non-sinusoidal waveform, e.g., like that shown in FIG. 3, and determine the information about the anomalies in the motor 20 based upon the irregularities in the sensed motor flux that distort the waveform of the magnetic flux sensed by the motor leakage sensor 20b and caused by the vibration. Similarly, one skilled in the art without undue experimentation would also be able to implement corresponding baseline signature analysis techniques to determine other type or kind of electrical and/or mechanical anomalies in the motor.

It is important to note that the scope of the invention is not intended to be limited to any particular type or kind of electrical and/or mechanical anomaly in the motor determined, and may include anomalies both now known and later developed in the future. In other words, embodiments are envisioned, and the scope of the invention is intended to include, determining other types or kind of anomalies than that set forth herein.

The apparatus 10 may also include one or more other modules, components, etc. generally indicated as 10b for implementing other functionality associated with the apparatus, but that does not form part of the underlying invention and is not described in detail.

The apparatus may also include the motor 20 having the outer housing 20a with the motor leakage flux detector 20b attached thereto, e.g., as shown in FIG. 5. By way of further example, the motor 20 may also include a rotor and stator combination 20c with windings, the current sensors 20d, as well as other motor components 20e that are known in the art.

Figure 6:
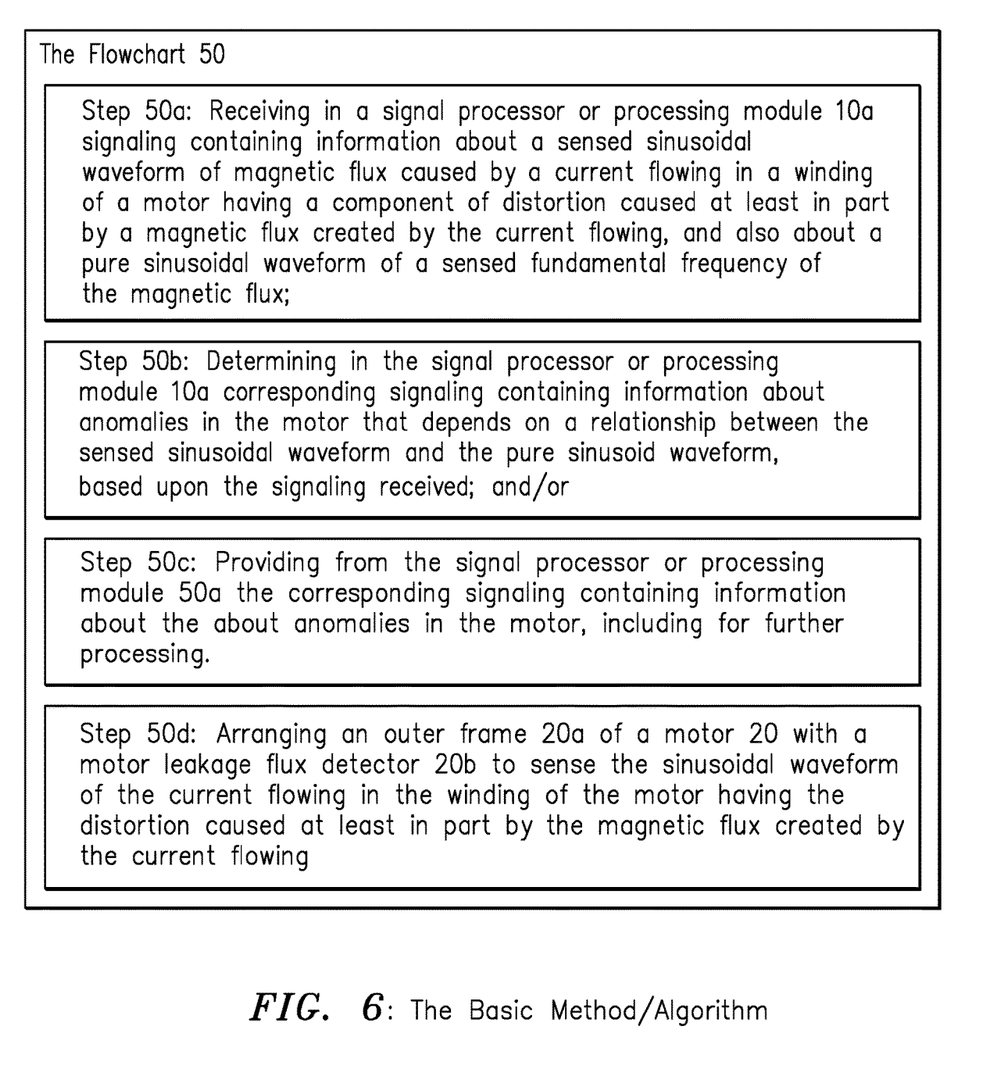
FIG. 6 shows a flowchart of a basic method/algorithm, according to some embodiments of the present invention.

FIG. 6: The Basic Method

FIG. 6 shows a flow chart 50 of a method/algorithm having steps for determining anomalies in a motor, according to some embodiments of the present invention, e.g., including implementing some combination of steps 50a, 50b, 50c and 50d. By way of example, the flowchart 50 includes, e.g., a step 50d for arranging the outer frame 20a of the motor 20 with the motor leakage flux detector 20b to sense the sinusoidal waveform of the current flowing in the winding of the motor having the distortion caused at least in part by the magnetic flux created by the current flowing.

The Scope of the Invention

It should be understood that, unless stated otherwise herein, any of the features, characteristics, alternatives or modifications described regarding a particular embodiment herein may also be applied, used, or incorporated with any other embodiment described herein. Also, the drawing herein is not drawn to scale.

Although the invention has been described and illustrated with respect to exemplary embodiments thereof, the foregoing and various other additions and omissions may be made therein and thereto without departing from the spirit and scope of the present invention.

What is claimed is:

1. An apparatus to detect a motor leakage flux anomaly, the apparatus comprising:
    a motor comprising an outer frame and a winding, wherein the motor is configured to drive a pump;
    a sensor attached to the outer frame, wherein the sensor configured to
      sense a sinusoidal waveform of magnetic flux caused by current that flows in the winding of the motor; and
    a signal processor configured to:
      receive a signal from the sensor that contains information about the sensed sinusoidal waveform, wherein the sinusoidal waveform has a component of distortion caused at least in part by the magnetic flux created by the current that flows in the winding of the motor;
      receive another signal that contains information about a pure sinusoidal waveform of a fundamental frequency of the sinusoidal waveform;
      compare the signal and the other signal;
      extract a non-sinusoidal magnetic flux waveform of magnetic flux distortion based on the comparison;
      compare the extracted non-sinusoidal magnetic flux waveform of magnetic flux distortion to a baseline non-sinusoidal magnetic flux waveform signature of the motor recorded during a period of proper operation; and
      generate a corresponding signal that contains information about anomalies in the motor based on the comparison of the extracted non-sinusoidal magnetic flux waveform of magnetic flux distortion to the baseline non-sinusoidal magnetic flux waveform signature.

2. The apparatus of claim 1, wherein the sensor is a motor magnetic flux sensor arranged in relation to the winding.

3. The apparatus of claim 2, wherein the sensor is a leakage magnetic flux sensor.

4. The apparatus of claim 1, wherein the signal processor is configured to extract the non-sinusoidal magnetic flux waveform of magnetic flux distortion through subtraction of the pure sinusoidal waveform from the sinusoidal waveform of magnetic flux distortion.

5. The apparatus of claim 1, wherein the signal processor is further configured to determine information about either a mechanical or an electrical pending failure of a component of the motor based on the magnetic flux distortion.

6. The apparatus of claim 5, wherein the mechanical failure includes vibration caused by a misalignment, an out of balance condition, or one or more failing bearings, and the electrical failure includes a partially shorted winding, a broken rotor bar, an eccentric air gap, or damaged laminations.

7. The apparatus of claim 5, wherein the signal processor is configured to determine the mechanical or the electrical pending failure of a component of the motor, through one or more of:
    amplification of the non-sinusoidal magnetic flux waveform of magnetic flux distortion though a dynamically boosted gain for further analysis;
    analysis of the baseline non sinusoidal flux waveform signature and the non-sinusoidal magnetic flux waveform of magnetic flux distortion to determine one or more minimum deviations of amplitude and frequency of the baseline non-sinusoidal flux waveform signature over time; or
    establishment of an alarm threshold for a deviation value that indicates an abnormal condition or a potential abnormal condition.

8. The apparatus of claim 1, wherein the signal processor is configured to perform a spectral analysis on the non-sinusoidal magnetic flux waveform of magnetic flux distortion to determine the anomalies.

9. The apparatus of claim 1, wherein the motor is an AC induction motor configured to draw a pure sinusoid waveform of current when supplied with a sinusoid AC voltage.

10. The apparatus of claim 1, wherein the signal processor is further configured to provide the corresponding signal that contains information about the anomalies in the motor as a control signal.

11. The apparatus of claim 10, wherein the provided corresponding signal contains information about one or more of a vibration caused by the misalignment, an out of balance condition, one or more failing bearings, a partially shorted winding, a broken rotor bar, an eccentric air gap, or damaged laminations.

12. A method to detect a motor leakage anomaly, the method comprising:
   sensing, by a sensor, a sinusoidal waveform of magnetic flux caused by a current flowing in a winding of a motor that drives a pump, wherein the sinusoidal waveform of magnetic flux has a component of distortion caused at least in part by a magnetic flux created by the current flowing;
   receiving, by a signal processor, a first signal from the sensor, wherein the first signal contains information about the sensed sinusoidal waveform of magnetic flux;
   receiving, by the signal processor, a second signal, wherein the second signal contains information about a pure sinusoidal waveform of a sensed fundamental frequency of the magnetic flux;
   comparing the first signal and the second signal;
   extracting a non-sinusoidal magnetic flux waveform of magnetic flux distortion based on the comparison;
   comparing the extracted non-sinusoidal magnetic flux waveform of magnetic flux distortion to a baseline non-sinusoidal magnetic flux waveform signature of the motor; and
   generating, by the signal processor, a corresponding signal that contains information about anomalies in the motor based upon the comparison of the extracted non-sinusoidal magnetic flux waveform of magnetic flux distortion to a baseline non-sinusoidal magnetic flux waveform signature of the motor.

13. A pump motor anomaly detection system, the system comprising:
   a pump;
   a motor comprising an outer frame and a winding, wherein the motor is configured to drive the pump;
   a sensor attached to the outer frame, wherein the sensor is configured to sense sinusoidal waveform of magnetic flux caused by a current that flows in the winding of the motor;
   a memory configured to store a baseline non-sinusoidal magnetic flux waveform signature of the motor recorded during a period of proper operation; and
   a controller configured to:
      receive a first signal from the sensor that contains information about the sensed sinusoidal waveform of magnetic flux, wherein the sinusoidal waveform of magnetic flux has a component of distortion caused at least in part by the magnetic flux created by the current;
      receive a second signal that contains information about a pure sinusoidal waveform of a fundamental frequency of the magnetic flux;
      compare the first signal and the second signal;
      extract a non-sinusoidal magnetic flux waveform of magnetic flux distortion based on the comparison;
      compare the extracted non-sinusoidal magnetic flux waveform of magnetic flux distortion to the stored baseline non-sinusoidal magnetic flux waveform signature of the motor; and
      generate a signal that contains information about an anomaly in the motor based on the comparison of the extracted non-sinusoidal magnetic flux waveform of magnetic flux distortion to the stored baseline non-sinusoidal magnetic flux waveform signature of the motor.

14. The system of claim 13, wherein the sensor is a leakage magnetic flux sensor or a current sensor.

15. The system of claim 13, wherein the controller is further configured to determine one or more of a vibration caused by a misalignment, an out of balance condition, one or more failing bearings, a partially shorted winding, a broken rotor bar, an eccentric air gap, or damaged laminations based on the comparison of the extracted non-sinusoidal magnetic flux waveform of magnetic flux distortion to the stored baseline non-sinusoidal magnetic flux waveform signature of the motor.

16. The system of claim 13, wherein the second signal is sensed from a supply voltage of the motor.

17. The system of claim 13, wherein the controller is further configured to perform one or more of an amplification or a spectral analysis of the extracted non-sinusoidal magnetic flux waveform of the magnetic flux distortion.

18. The system of claim 13, wherein the anomaly in the motor is an abnormal condition to cause immediate damage or a potential abnormal condition not to cause immediate damage.

* * * * *